(12) United States Patent
Ebihara et al.

(10) Patent No.: US 10,498,993 B1
(45) Date of Patent: Dec. 3, 2019

(54) RAMP SIGNAL SETTLING REDUCTION CIRCUITRY

(71) Applicant: OmniVision Technologies, Inc., Santa Clara, CA (US)

(72) Inventors: Hiroaki Ebihara, Santa Clara, CA (US); Rui Wang, San Jose, CA (US); Liang Zuo, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/287,848

(22) Filed: Feb. 27, 2019

(51) Int. Cl.
| | |
|---|---|
| *H04N 5/3745* | (2011.01) |
| *H03M 1/56* | (2006.01) |
| *H04N 5/353* | (2011.01) |
| *H04N 5/378* | (2011.01) |

(52) U.S. Cl.
CPC .......... *H04N 5/37455* (2013.01); *H03M 1/56* (2013.01); *H04N 5/353* (2013.01); *H04N 5/378* (2013.01)

(58) Field of Classification Search
CPC .... H04N 5/37455; H04N 5/353; H04N 5/378; H03M 1/56
See application file for complete search history.

(56) References Cited

U.S. PATENT DOCUMENTS

| | | | | |
|---|---|---|---|---|
| 5,315,199 | A * | 5/1994 | McCracken | H02K 5/148 310/239 |
| 6,961,015 | B2 * | 11/2005 | Kernahan | H02M 3/157 341/155 |
| 7,230,561 | B2 * | 6/2007 | Lee | G06J 1/00 341/144 |
| 9,307,173 | B2 | 4/2016 | Takamiya et al. | |
| 2009/0167326 | A1 * | 7/2009 | Geaghan | G01D 5/24 324/678 |
| 2015/0229859 | A1 * | 8/2015 | Guidash | H04N 5/35554 348/308 |
| 2017/0373595 | A1 * | 12/2017 | Huang | H02M 3/158 |
| 2018/0167573 | A1 * | 6/2018 | Zhu | H04N 5/378 |
| 2019/0268557 | A1 * | 8/2019 | Kawahito | H04N 5/378 |

* cited by examiner

*Primary Examiner* — Chiawei Chen
(74) *Attorney, Agent, or Firm* — Christensen O'Connor Johnson Kindness PLLC

(57) ABSTRACT

Comparison circuitry includes a comparator having a first input configured to receive a pixel signal. A switch is coupled to a second input of the comparator, a reference generator, and a ramp generator. A first capacitance is coupled to the switch. The switch is configured to couple the first capacitance to the reference generator to charge the first capacitance to a reference voltage from the reference generator prior to a ramp event in a ramp signal, and to couple the first capacitance to the ramp signal from the ramp generator at an onset of the ramp event in the ramp signal. The first capacitance is coupled to provide positive current injection into the ramp signal at the onset of the ramp event in the ramp signal to reduce a ramp settling time in the ramp signal, which is provided to the second input of the comparator.

18 Claims, 7 Drawing Sheets

RAMP SIGNAL SETTLING REDUCTION CIRCUITRY

BACKGROUND INFORMATION

Field of the Disclosure

This disclosure relates generally to image sensors, and in particular but not exclusively, relates to comparator circuitry for use with a ramp generator in analog to digital conversion in an image sensor.

Background

Image sensors have become ubiquitous. They are widely used in digital still cameras, cellular phones, security cameras, as well as medical, automobile, and other applications. The technology used to manufacture image sensors has continued to advance at a great pace. For example, the demands of higher resolution and lower power consumption have encouraged the further miniaturization and integration of these devices.

Image sensors conventionally receive light on an array of pixels, which generates charge in the pixels. The intensity of the light may influence the amount of charge generated in each pixel, with higher intensity generating higher amounts of charge. Analog to digital converters (ADCs) are often used in CMOS image sensors (CIS) to convert the charge into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge.

It is appreciated that the ramp settling time, or delay, of the ramp signal that is generated by the ramp generator and received by the comparator can limit the maximum frame rate of the image sensor. Thus, reducing the ramp settling time of the ramp signal that is received by the comparator can increase the maximum frame rate and therefore the performance of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
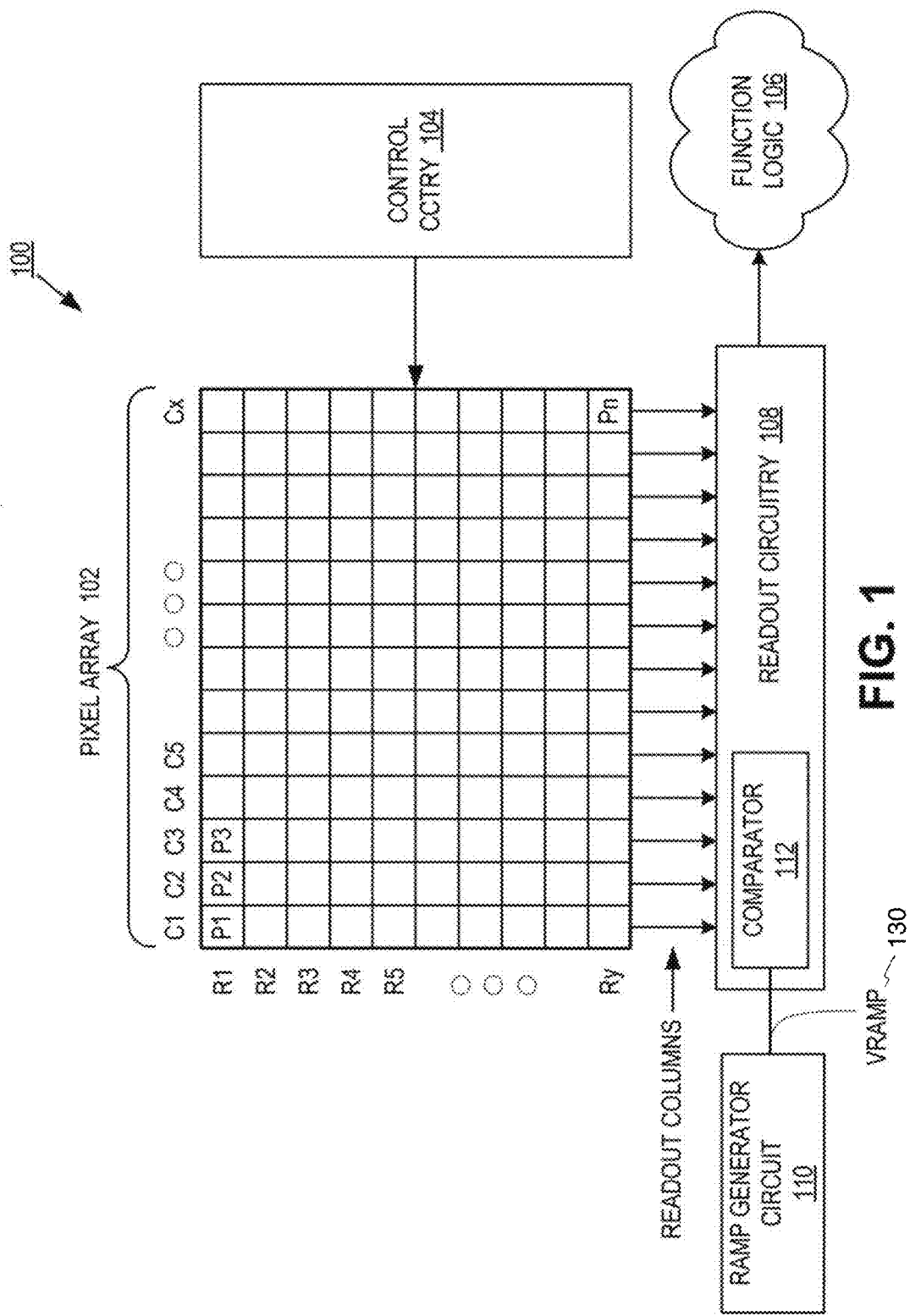
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to comparison circuitry including comparator input circuitry that reduces ramp signal settling time are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to read out image data from the plurality of photodiodes in pixel array 102. In various examples, readout circuitry 108 may include amplification circuitry, analog to digital (ADC) conversion circuitry, or otherwise. In some embodiments, one or more comparators 112 may be included for each of the readout columns. The one or more comparators 112 may be included in a respective analog to digital converter (ADC) included in the readout circuitry 108, for example. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage ramp signal VRAMP 130 from a ramp generator circuit 110. VRAMP 130 may be received by the comparator 112, which may also receive an image charge signal from a pixel of the pixel array 102. The comparator 112 may determine a digital representation of the image charge using a counter based on a comparison of VRAMP 130 to the image charge voltage level. In one example, the output circuitry of comparator 112 transitions from a first state to a second state when the input VRAMP 130 voltage reaches the input image charge voltage level. In the example, the value in a counter coupled to the comparator in the ADC may be used to generate the digital representation of the image charge. As will be discussed in further detail below, the ramp settling time, or delay, of the ramp signal VRAMP 130 that is generated by the ramp generator 110 and received by the comparator 112 through comparator input circuitry is reduced to increase the maximum frame rate and therefore improve the performance of the imaging system 100 in accordance with the teachings of the present invention.

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2B:
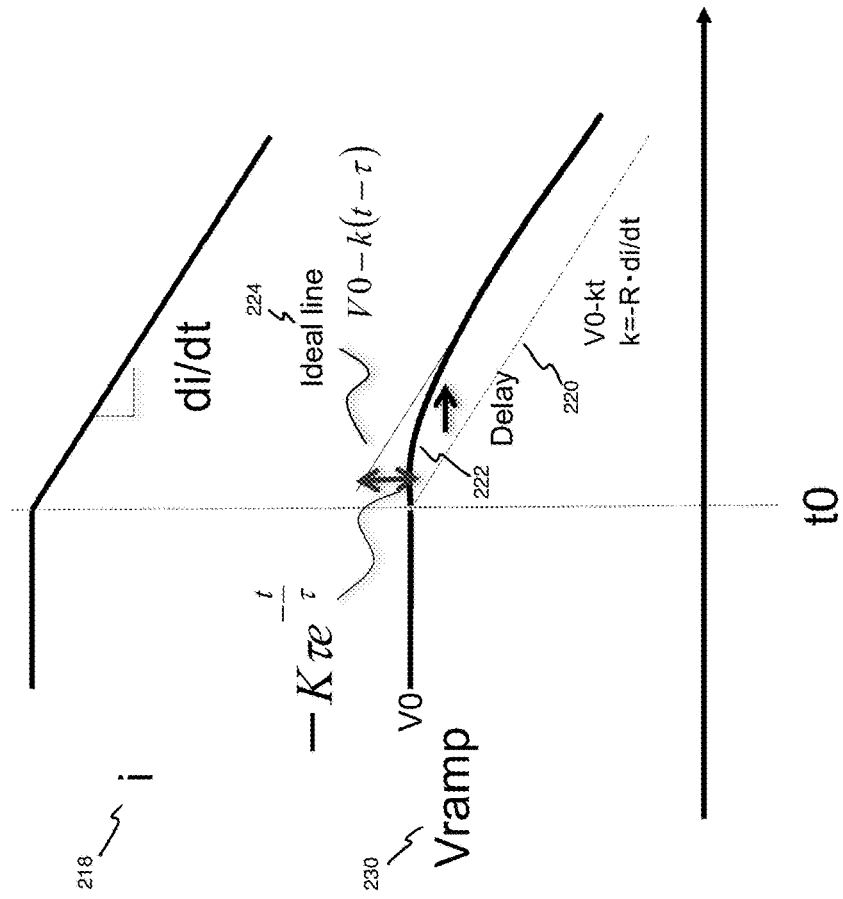
FIG. 2B is a timing diagram that illustrates some signals including a ramp signal of the example ramp generator illustrated in FIG. 2A.
Figure 2A:
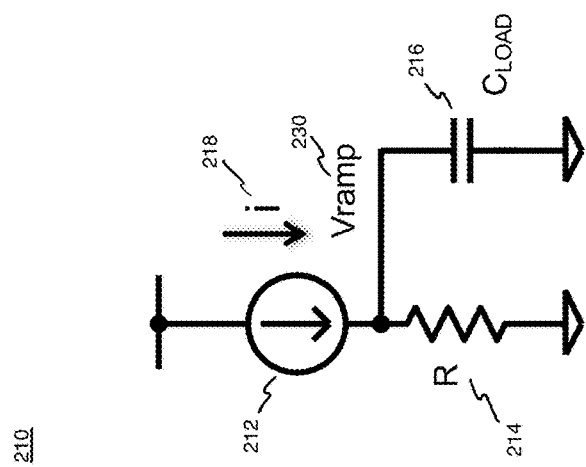
FIG. 2A shows a schematic of an example of a ramp generator that generates a ramp signal to be received by an example comparator in accordance with the teachings of the present invention.

FIG. 2A shows a schematic of an example of a ramp generator 210 for use with a comparator in an analog to digital converter in an image sensor in accordance with the teachings of the present invention. It is noted that ramp generator 210 of FIG. 2A may be an example of ramp generator 110 of FIG. 1, and that similarly named and numbered elements referenced below are coupled and function similar to as described above. In the example depicted in FIG. 2A, it is appreciated that ramp generator 210 is a current steering implementation. As such, ramp generator 210 includes a current source 212 that provides a current 218, which is coupled to a resistance R 214 and a loading capacitance $C_{LOAD}$ 216 to generate a ramp signal VRAMP 230 as shown.

Although a current steering implementation is illustrated in FIG. 2A to generate ramp signal VRAMP 230 for explanation purposes, it is appreciated that other ramp generation examples may also be employed and still enjoy the benefits of the techniques described below in accordance with the teachings of the present invention. For instance, in another example, a current integration based ramp generator to generate ramp signal VRAMP 230 may also be utilized in accordance with the teachings of the present invention.

FIG. 2B is a timing diagram that illustrates some signals including a ramp signal of the example current steering example ramp generator illustrated in FIG. 2A. As shown in the example depicted in FIG. 2B, the current 218 starts to decrease at time t0. The dashed line 220 shows what the VRAMP signal 230 would be without the loading capacitance 216. However, the solid line 222 shows that the actual VRAMP signal 230 is delayed from the dashed line 220 depending on the resistance R 214 of the current steering circuitry of ramp generator 210 and the loading capacitance 216 on the VRAMP signal 230.

As shown in FIG. 2B, the resistance R 214 and the loading capacitance 216 cause non-linearity and delay in the ramp signal VRAMP 230 at the onset of the ramp event at time t0. The non-linear delayed ramp event in the delayed ramp signal can be characterized by:

$$\text{Delayed Ramp Signal: } V0 - K(t-\tau) - K\tau e^{-\frac{t}{\tau}}.$$

The delayed ramp signal asymptotics to the ideal line 224 shown in FIG. 2B. The ideal line 224 is delayed by τ (time constant of Vramp: τ=R·C, where C is the loading capacitance) from the ramp signal VRAMP 230 without loading capacitance $C_{LOAD}$ 216 and can be characterized by the linear function:

$$\text{Ideal Line: } V0 - K(t-\tau).$$

The non-linear portion of the ramp signal VRAMP 230 can be characterized by the difference between VRAMP 230 and the ideal line 224.

$$\text{The non-linear portion: } -K\tau e^{-\frac{t}{\tau}}$$

The non-linear portion of the ramp event in the ramp signal VRAMP 230 is not useful for analog to digital conversion.

Consequently, the analog to digital conversion is delayed until the linear portion of the ramp event in the ramp signal. A major consequence of the non-linear is increased ramp settling time, which increases the amount of time required to read image data from the image sensor, which decreases the possible maximum frame rate of the image sensor.

Figure 3:
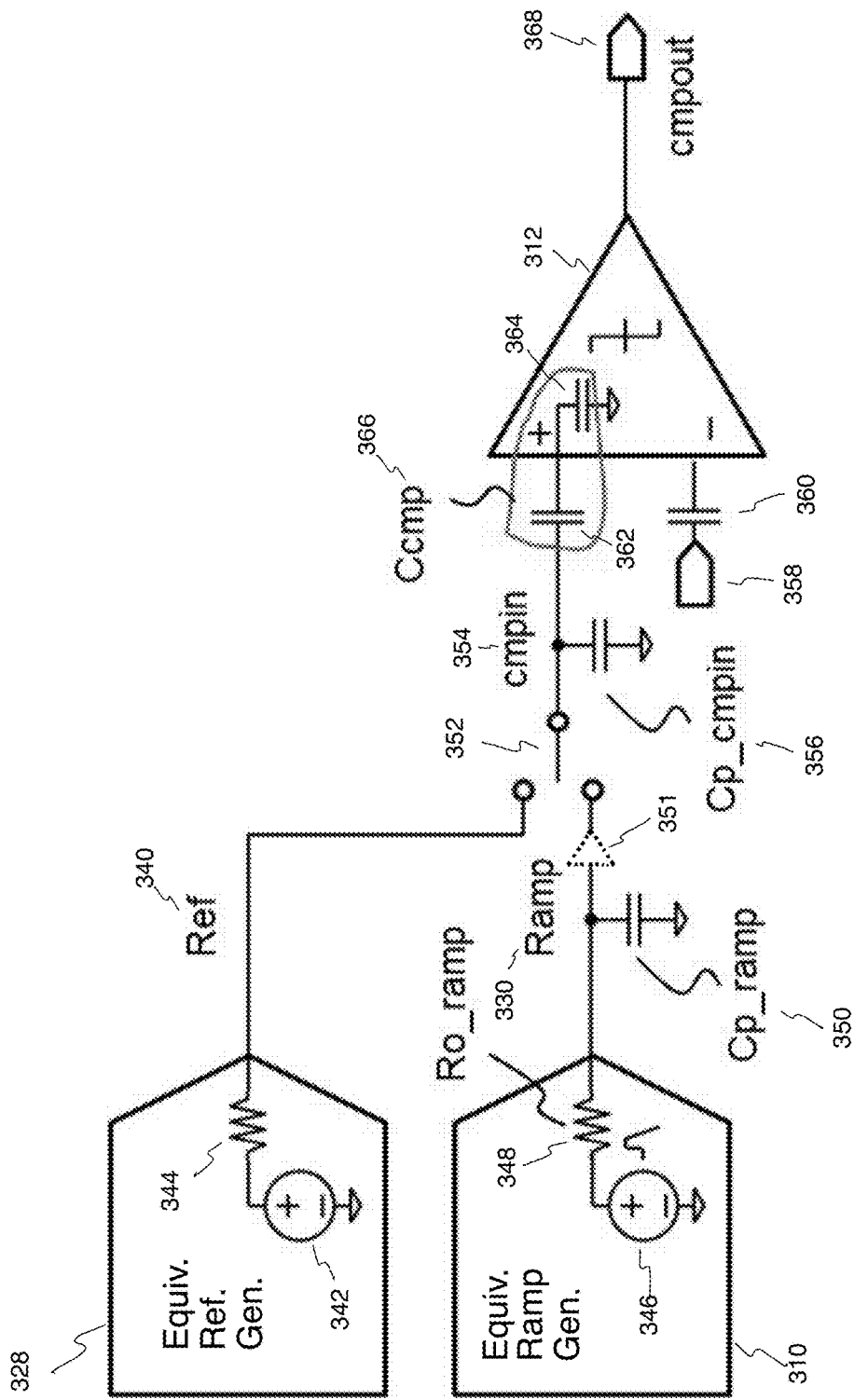
FIG. 3 is schematic illustrating an example of comparison circuitry including example comparator input circuitry coupled to a ramp generator and a reference generator in accordance with the teachings of the present invention.

FIG. 3 is schematic illustrating an example of comparison circuitry including an equivalent circuit for a comparator 312 with example comparator input circuitry coupled to an equivalent circuit for a ramp generator 310 and an equivalent circuit for a reference generator 328 in accordance with the teachings of the present invention. It is noted that ramp generator 310 and comparator 312 of FIG. 3 may be examples of ramp generators and comparators illustrated above in FIGS. 1-2B, and that similarly named and numbered elements referenced below are coupled and function similar to as described above. As shown in the depicted example, comparator 312 is illustrated having first and second inputs and an output. In the depicted example, comparator 312 is illustrated as an op amp having a comparator output cmpout 368, a non-inverting input, and an inverting input.

In one example, the inverting input of comparator 312 is configured to receive an image charge signal 358 through a capacitance 360. The image charge signal 358 may be a pixel signal representative of image data received from the pixel of a pixel array through a bitline, as illustrated for instance in FIG. 1.

The non-inverting input of comparator 312 is illustrated in FIG. 3 as being coupled to an internal capacitance 364. A capacitance 362 that is external to comparator 312 is illustrated as being coupled to the non-inverting input of comparator 312. In the illustrated example, the equivalent combined capacitance of capacitance 362 and internal capacitance 364 at the non-inverting input of comparator 312 is illustrated in FIG. 3 as capacitance Ccmp 366.

The example shown in FIG. 3 also illustrates comparator input circuitry coupled to provide a comparator input signal cmpin 354 to the non-inverting input of comparator 312. In the illustrated example, the comparator input signal cmpin 354 is provided to the non-inverting input of comparator 312 through capacitance 362. In the illustrated example, the comparator input circuitry includes a comparator input capacitance Cp_cmpin 356 and a switch 352. Capacitance Cp_cmpin 356 is coupled between switch 352 and ground. Cp_cmpin 356 provides the comparator input signal cmpin 354, which is capacitively coupled to the non-inverting input of comparator 312 through capacitance 362. In the depicted example, switch 352 is also coupled to reference generator 328 and ramp generator 310 as shown.

In the example, the switch 352 is configured to couple capacitance Cp_cmpin 356 to the reference generator 328 to charge the capacitance Cp_cmpin 356 to the reference voltage Ref 340 from the reference generator 328 prior to a ramp event in the ramp signal Ramp 330 from the ramp generator 310. Then, the switch 352 is further configured to couple the capacitance Cp_cmpin 356 to the ramp signal Ramp 330 from the ramp generator 310 at an onset of the ramp event in the ramp signal Ramp 330. In so doing, the capacitance Cp_cmpin 356 is coupled to provide positive current injection received from the reference voltage Ref 340 into the ramp signal Ramp 330 at the onset of the ramp event in the ramp signal Ramp 330 to reduce a ramp settling time in the ramp signal Ramp 330, which is coupled to be provided via comparator input cmpin 354 to the non-inverting input of comparator 312 through capacitance 362 in accordance with the teachings of the present invention.

In various examples, it is appreciated that the comparator input circuitry, including for example one or more of capacitance Cp_cmpin 356, switch 352, and/or capacitances 360 and 362 may be included inside the comparator (e.g., comparator 312) in accordance with the teachings of the present invention. In other examples, it is appreciated one or more of capacitance Cp_cmpin 356, switch 352, and/or capacitances 360 and 362 may be included external to comparator 312 in accordance with the teachings of the present invention. For instance, in an example in which switch 352 is outside of the comparator, switch 352 may be included in a digital to analog converter (DAC) so that there my be one global switch 352 or only a few global switches 352.

In other various examples, it is appreciated that an optional ramp buffer 351 may also be included and coupled between the output of ramp generator 310 and the switch 352. In such examples, the ramp buffer 351 could be used to buffer the ramp signal Ramp 330, and may be included for example in CMOS image sensor configurations with ramp analog to digital converters (ADCs). In such examples, distributed ramp buffers 351 may be utilized to reduce kick back from the comparator 312 to the ramp signal 330 or just to increase the bandwidth of the signal chain from the ramp generator 310 to the comparator 312.

Referring back to the example depicted in FIG. 3, an equivalent circuit of reference generator 328 is configured to generate a reference voltage Ref 340. In the illustrated example, the equivalent circuit of reference generator 328 is depicted as including an internal voltage source 342 coupled to a output resistance 344 to provide a constant reference voltage Ref 340.

In the example depicted in FIG. 3, an equivalent circuit of ramp generator 310 is configured to generate a ramp voltage Ramp 330. The example illustrates the equivalent circuit of ramp generator 310 as including an internal voltage source 346 coupled to an output resistance Ro_ramp 348 to provide the ramp signal Ramp 330 at an output of the ramp generator 310. A capacitance Cp_ramp 350 represents a capacitance on the ramp signal Ramp 33, and illustrated as being coupled between the output of ramp generator 310 and ground.

In operation, switch 352 of the comparator input circuitry is configured to charge capacitance Cp_cmpin 356 to the reference voltage Ref 340 from the reference generator 328 prior to a ramp event in the ramp signal Ramp 330. Then, at the onset of the ramp event in the ramp signal Ramp 330, the switch 352 is then configured to couple the capacitance Cp_cmpin 356 to provide positive current injection into the ramp signal Ramp 330, which is coupled to be provided to the comparator 312 during the ramp event in accordance with the teachings of the present invention.

Figure 4:
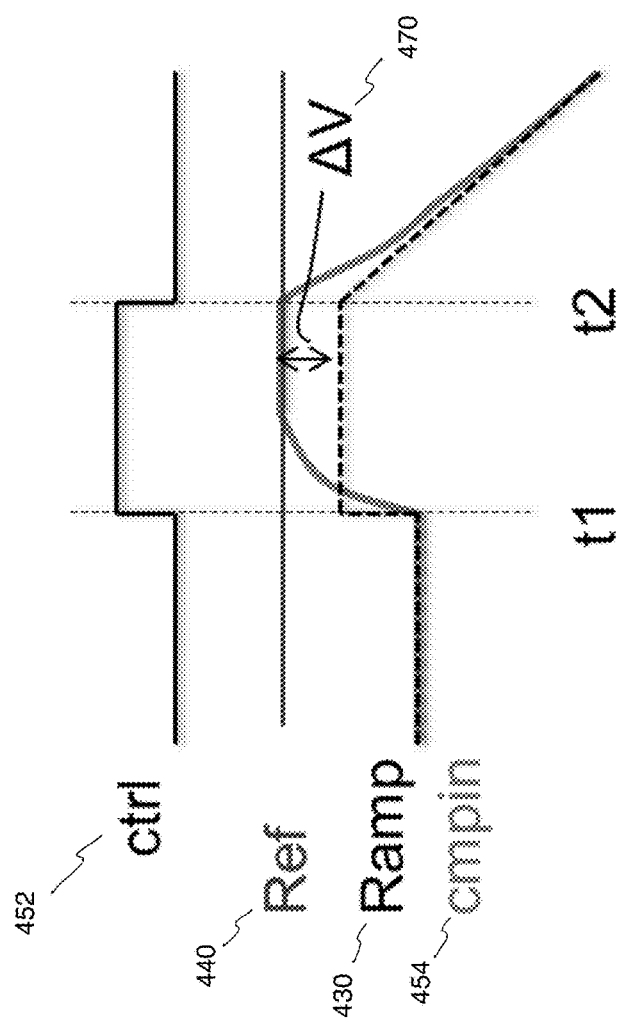
FIG. 4 is an example timing diagram that illustrates examples of a control signal, a ramp signal, a reference, and a comparator input signal as illustrated in FIG. 3 in accordance with the teachings of the present invention.

To illustrate, FIG. 4 is an example timing diagram that illustrates examples a control signal ctrl 452, a reference signal Ref 440, a ramp signal Ramp 430, and a comparator input signal cmpin 454 in accordance with the teachings of the present invention. In the example, it is appreciated that control signal ctrl 452, reference signal Ref 440, ramp signal Ramp 430, comparator input signal cmpin 454 are examples of signals found in FIG. 3 in accordance with the teachings of the present invention. As such, it is appreciated that similarly named and numbered elements referenced below are coupled and function similar to as described above.

In one example, the control signal ctrl 452 toggles between a first state and a second state during operation. When in the first state (e.g., logic low), control signal ctrl 452 controls the switch 352 to couple the Cp_cmpin capacitance 354 to the ramp generator 310 in FIG. 3. When in the second state (e.g., logic high), control signal ctrl 452 controls the switch 352 to couple the Cp_cmpin capacitance 354 to the reference generator 328 in FIG. 3.

In addition, in the example shown in FIG. 3, the ramp signal Ramp 430 transitions from a first lower constant level to a higher second constant level when the control signal ctrl 452 transitions from the first state to the second state. In the illustrated example, a ramp event (e.g., the ramp in the ramp signal) begins when the control signal ctrl 452 transitions from the second stage to the first state.

To illustrate, the example shown in FIG. 4 illustrates that prior to time T1, the control signal ctrl 452 is in the first state. As such, the switch 352 couples the capacitance Cp_cmpin 356 to the ramp generator 310 to receive the ramp signal Ramp 430. In addition, the ramp signal Ramp 430 is a first lower constant level. As a result, the comparator input signal cmpin 454 (e.g., the voltage across capacitance Cp_cmpin 356 in FIG. 3) is precharged or initialized to the same first lower constant level of the ramp signal Ramp 430 prior to time T1.

At time T1, the control signal ctrl 452 transitions from the first state to the second state. Thus, the ramp signal Ramp 430 transitions from a first lower constant level to a higher second constant level at time T1 as shown. In addition, the switch 352 couples the capacitance Cp_cmpin 356 to the reference generator 328 to receive the constant reference voltage Ref 440 prior to a ramp event in the ramp signal, which begins at time T2. As shown in the depicted example, the constant reference voltage Ref 440 is greater than the value of the ramp signal Ramp 430 prior to the ramp event. In particular, the constant reference voltage Ref 440 is equal to the second higher constant level of the ramp signal Ramp 430 plus a voltage ΔV 470. As a result, the comparator input signal cmpin 454 (e.g., the voltage across capacitance Cp_cmpin 356 in FIG. 3) is pulled up or charged up to the higher reference voltage Ref 440, which is equal ramp signal Ramp 430+ΔV at time T1, which is prior to the ramp event in the ramp signal Ramp 430.

At time T2, the onset of the ramp event begins, and the ramp signal Ramp 430 value therefore begins ramping down as shown. In addition, the control signal ctrl 452 transitions back to the first state, which causes the switch 352 to couple the capacitance Cp_cmpin 356 back to the ramp generator 310. However, at this time the capacitance Cp_cmpin 356 has been charged up to the higher constant reference voltage Ref 440, which is equal to the sum of the ramp signal Ramp 430 and ΔV 470.

Therefore, at time T2, when ramp event begins and the ramp signal Ramp 430 begins to decrease with time, the voltage of the comparator input signal cmpin 454 across the Cp_cmpin capacitance 356 is greater than the voltage of the ramp signal Ramp 430. As a result, there is positive charge injection from the Cp_cmpin capacitance 356 into the ramp signal Ramp 430 at time T2 when the comparator input voltage cmpin 354 connection is switched by switch 352 from the reference generator 328 to the ramp generator 310. This positive charge injection from the Cp_cmpin capacitance 356 generates a compensation signal that compensates for ramp settling error in accordance with the teachings of the present invention. As such, the resulting ramp event that is received at the non-inverting input of the comparator 312 is substantially more linear as illustrated in FIG. 4 via the comparator input voltage cmpin 454 in accordance with the teachings of the present invention.

For a first order system, the initial error at time T2 at the onset of a ramp event in the ramp signal Ramp 430 can be assumed to be approximately equal to −Kτ. To compensate for this initial error at time T2, the voltage at cmpin 354 received by the comparator 312 is increased by ΔV=Kτ at time T2 by the positive charge injection from Cp_cmpin 356. Referring back to the equivalent circuit shown in FIG. 3 and assuming a first order system, the time constant τ of the ramp signal during analog-to-digital conversion is:

$$\tau = Ro\_ramp(Cp\_ramp + Cp\_cmpin + Ccmp),$$

where Ro_ramp is the equivalent output resistance 348 of the ramp generator 310, Cp_ramp is the capacitance 350 on the ramp signal Ramp 330, Cp_cmpin is the capacitance on the comparator input cmpin 354, and Ccmp is the equivalent input capacitance 366 of the comparator 312. In this way, a constant voltage difference ΔV 470 can be defined as follows:

$$\Delta V = K\tau \frac{Cp\_cmpin + Ccmp}{Cp\_ramp + Cp\_cmpin + Ccmp}$$

Therefore, assuming Kτ is a constant, the constant voltage difference ΔV 470 is equal to a product of the constant Kτ and the quotient of the sum of Cp_cmpin and Ccmp, and the sum of Cp_ramp, Cp_cmpin, and Ccmp. In this way, the positive charge injection from Cp_cmpin 356 therefore generates Kτ of settling error at time T2 to reduce a ramp settling time in the ramp signal in accordance with the teachings of the present invention.

Figure 5:
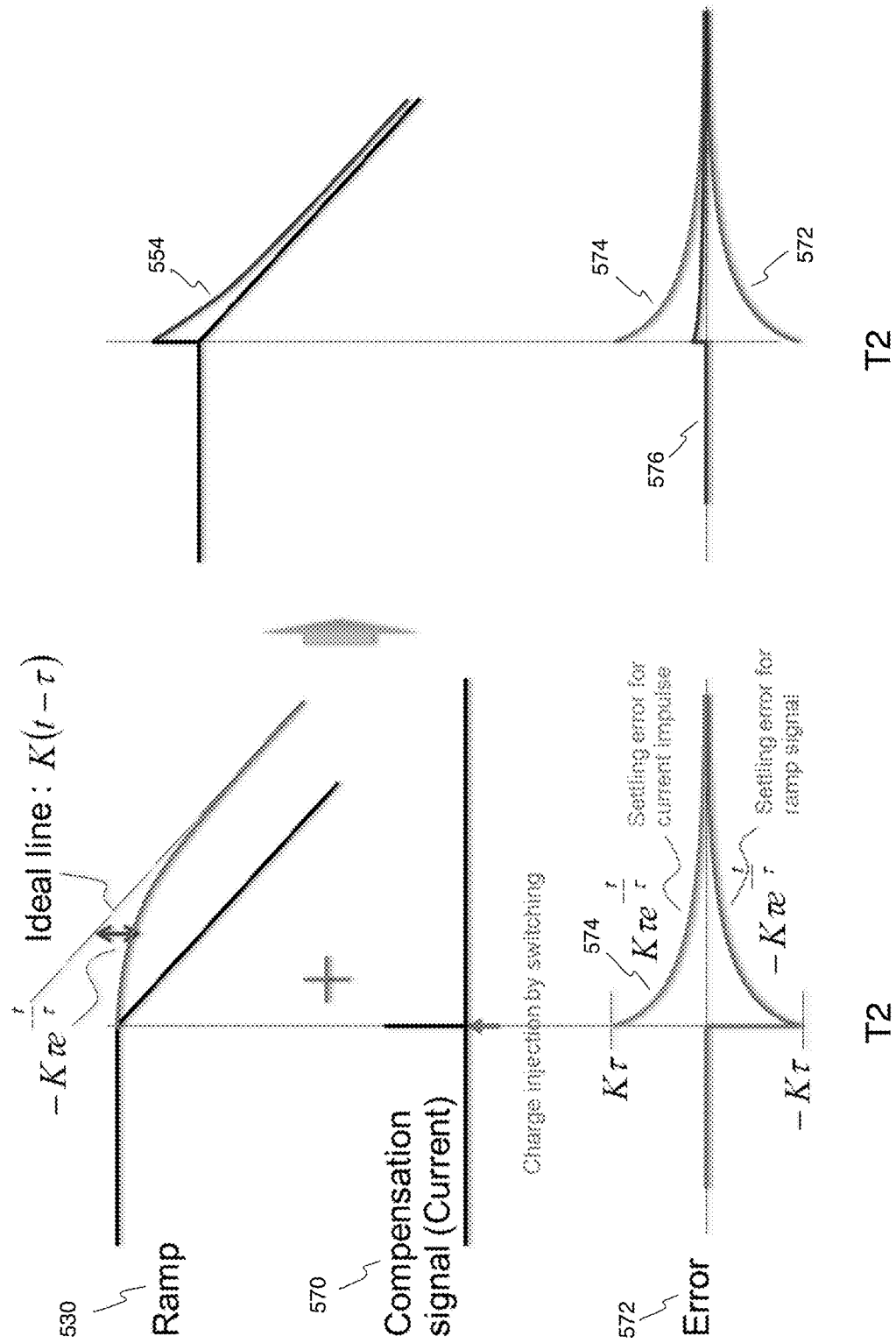
FIG. 5 is another example timing diagram that further illustrates some example signals including an example compensation signal and ramp signal of the example ramp generator, reference generator, and comparator illustrated in FIGS. 3-4 in accordance with the teachings of the present invention.

To further illustrate, FIG. 5 is another example timing diagram that also shows the example compensation signal and ramp signal of the example ramp generator, reference generator, and comparator as discussed above for a first order system in accordance with the teachings of the present invention. As shown in FIG. 5, the ramp signal Ramp 530 after time T2 without compensation is non-linear and delayed, and the non-linear portion is characterized by:

$$\text{Non-linear portion: } -K\tau e^{-\frac{t}{\tau}}.$$

The ramp signal symptotics to a linear ideal line which is characterized by:

$$\text{Ideal Line: } V0 - K(t-\tau).$$

Compensation signal 570 shows a current pulse that occurs at time T2, which provides current injection when the switch 352 switches from being coupled to reference generator 328 to be coupled to the ramp generator 310 in accordance with the teachings of the present invention. As such, the combination of the ramp signal Ramp 530 and the compensation signal 570 results in the substantially linear corrected ramp signal 554 as shown on the top right of FIG. 5.

Furthermore, as shown at the bottom of FIG. 5, the error 572 is −Kτ at time T2, which is at the onset of the ramp event in the ramp signal Ramp 530. After time T2, the error 572 decreases over time according to the function:

$$-K\tau e^{-\frac{t}{\tau}}.$$

The compensation over time provided by the current impulse of the compensation signal 570 is illustrated with the correction component 574, which is approximately Kτ at time T2, and then decreases over time to compensate for error 572 according to the function:

$$K\tau e^{-\frac{t}{\tau}}.$$

Therefore, the combination of the error 572 and the correction component 574 is illustrated as being substantially zero with combined error signal 576 as shown on the bottom right of FIG. 5.

Figure 6:
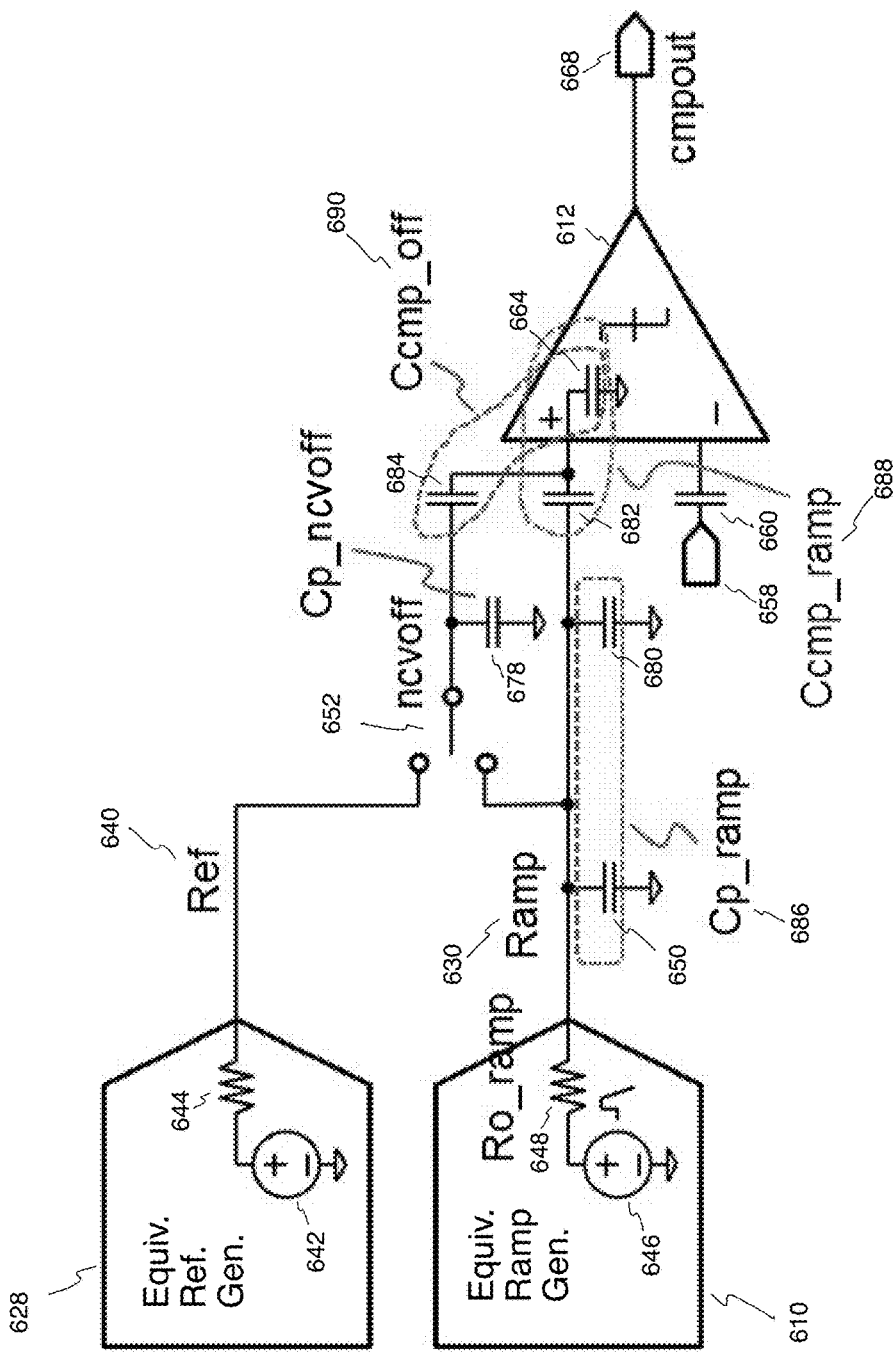
FIG. 6 is schematic illustrating another example of comparison circuitry including example comparator input circuitry coupled to a ramp generator and a reference generator in accordance with the teachings of the present invention.

FIG. 6 is schematic illustrating another example of comparison circuitry with a comparator, a ramp generator, and a reference generator. The comparator includes example comparator input circuitry coupled to a ramp generator and a reference generator in accordance with the teachings of the present invention. It is noted that the example circuitry illustrated in FIG. 6 shares many similarities with the example circuitry illustrated in FIG. 3, and that similarly named and numbered elements referenced below are coupled and function similar to as described above. It is appreciated that the elements in common between the example circuitry in FIG. 3 and FIG. 6 will not be described again for the sake of brevity. However, one difference between the example circuitry illustrated in FIG. 6 and the example circuitry in FIG. 3 is that in the example circuitry illustrated in FIG. 6, only a portion of the comparator input capacitances are switched.

In particular, as shown in the example depicted in FIG. 6, switch 652 is coupled to the non-inverting input of the comparator 612, the reference generator 628, and the ramp generator 628. In addition, a capacitance Cp_ncvoff 678 is also coupled to switch 652. Similar to the previously described examples, the switch 652 is configured to couple capacitance Cp_ncvoff 678 to the reference generator 628 to charge the capacitance Cp_ncvoff 678 to the reference voltage Ref 640 from the reference generator 628 prior to a ramp event in the ramp signal Ramp 630 from the ramp generator 610. Then, the switch 652 is further configured to couple the capacitance Cp_ncvoff 678 to the ramp signal Ramp 630 from the ramp generator 610 at an onset of the ramp event in the ramp signal Ramp 630. In so doing, the capacitance Cp_ncvoff 678 is coupled to provide positive current injection received from the reference voltage Ref 640 into the ramp signal Ramp 630 at the onset of the ramp event in the ramp signal Ramp 630, which is coupled to be provided to the non-inverting input of the comparator 612.

As depicted in the example shown in FIG. 6, the time constant r of the ramp signal during analog-to-digital conversion is:

$$\tau = Ro\_\text{ramp}(Cp\_\text{ramp} + Cp\_ncvoff + Ccmp\_off + Ccmp\_ramp),$$

where Ro_ramp is the equivalent output resistance 648 of the ramp generator 610, Cp_ramp is the equivalent capacitance 686 (including capacitance 650 and capacitance 680) on the ramp signal Ramp 630, Cp_ncvoff is the capacitance 678 on the ncvoff signal voltage across the capacitance Cp_ncvoff 678, and Ccmp_off and Ccmp_ramp are the equivalent capacitances 690 (including capacitance 684 and capacitance 664) and 688 (including capacitance 682 and capacitance 664) from the ncvoff and ramp inputs, respectively, to the non-inverting input of comparator 612. In the depicted example, the Ccmp_off 690 capacitance is the equivalent input capacitance to the non-inverting input of the comparator 612 when the switch 652 is switched to select the reference generator 628, and the Ccmp_ramp 688 capacitance is the equivalent input capacitance to the non-inverting input of the comparator 612 when the switch 652 is switched to select the ramp generator 610.

In the example illustrated in FIG. 6, the constant voltage difference ΔV to cancel the ramp settling error can therefore be defined as follows:

$$\Delta V = K\tau \frac{Cp\_ncvoff + Ccmp\_off}{Cp\_\text{ramp} + Cp\_ncvoff + Ccmp\_off + Ccmp\_\text{ramp}}$$

Thus, assuming Kτ is a constant, the constant voltage difference ΔV for the example illustrated in FIG. 6 is equal to a product of the constant Kτ and the quotient of the sum of Cp_ncvoff and Ccmp_off, and the sum of Cp_ramp, Cp_ncvoff, Ccmp_off, and Ccmp_ramp. Similar to the example described in FIG. 3 above, the positive charge injection in the example described in FIG. 6 also generates Kτ of settling error at time T2 to reduce a ramp settling time in the ramp signal in accordance with the teachings of the present invention.

Figure 7:
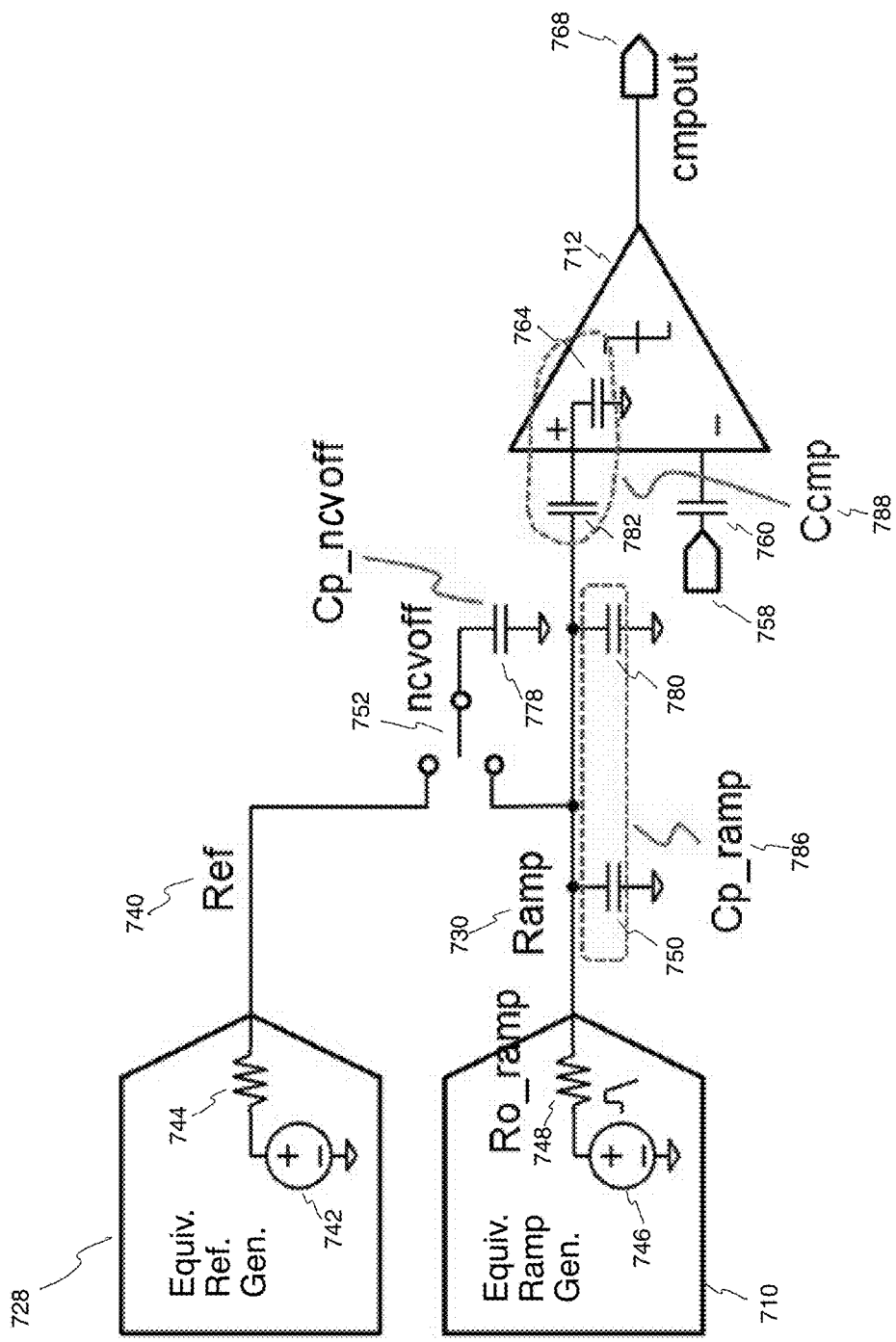
FIG. 7 is schematic illustrating yet another example of comparison circuitry including example comparator input circuitry coupled to a ramp generator and a reference generator in accordance with the teachings of the present invention.

FIG. 7 is schematic illustrating yet another example of comparison circuitry including a comparator, a ramp generator, and a reference generator. The comparator includes example comparator input circuitry coupled to a ramp generator and a reference generator in accordance with the teachings of the present invention. It is noted that the example circuitry illustrated in FIG. 7 shares many similarities with the example circuitry illustrated in FIG. 3 and FIG. 6, and that similarly named and numbered elements referenced below are coupled and function similar to as described above. It is appreciated that elements in common between the example circuitry in FIG. 3, FIG. 6, and FIG. 7 will not be described again for the sake of brevity. However, one difference between the example circuitry illustrated in FIG. 7 and the example circuitry in FIG. 3 and FIG. 6 is that in the example circuitry illustrated in FIG. 7, the capacitance Cp_ncvoff 778 is not connected to the comparator 712 as shown.

In particular, as shown in the example depicted in FIG. 7, switch 752 is coupled to the non-inverting input of the comparator 712, the reference generator 728, and the ramp generator 728. In addition, a capacitance Cp_ncvoff 778 is also coupled to switch 752. Similar to the previously described examples, the switch 752 is configured to couple capacitance Cp_ncvoff 778 to the reference generator 728 to charge the capacitance Cp_ncvoff 778 to the reference voltage Ref 740 from the reference generator 728 prior to a ramp event in the ramp signal Ramp 730 from the ramp generator 710. Then, the switch 752 is further configured to couple the capacitance Cp_ncvoff 778 to the ramp signal Ramp 730 received from the ramp generator 710 at an onset of the ramp event in the ramp signal Ramp 730. In so doing, the capacitance Cp_ncvoff 778 is coupled to provide positive current injection from the reference voltage Ref 740 into the ramp signal Ramp 730 at the onset of the ramp event in the ramp signal Ramp 730, which is coupled to be provided to the non-inverting input of the comparator 712 in accordance with the teachings of the present invention.

In the example depicted in FIG. 7, the time constant r of the ramp signal during analog-to-digital conversion is:

$$r = Ro\_\text{ramp}(Cp\_\text{ramp} + Cp\_ncvoff + Ccmp),$$

where Ro_ramp is the equivalent output resistance 748 of the ramp generator 710, Cp_ramp is the equivalent capacitance 786 (including capacitance 750 and capacitance 780) on the ramp signal Ramp 730, Cp_ncvoff is the capacitance 778 on the ncvoff signal voltage across the capacitance Cp_ncvoff 778, and Ccmp is equivalent input capacitance 788 (including capacitance 782 and capacitance 764) of the non-inverting input of comparator 712.

In the example illustrated in FIG. 7, the constant voltage difference ΔV to cancel the ramp settling error can therefore be defined as follows:

$$\Delta V = K\tau \frac{Cp\_ncvoff}{Cp\_ramp + Cp\_ncvoff + Ccmp}$$

Thus, assuming Kτ is a constant, the constant voltage difference ΔV for the example illustrated in FIG. 7 is equal to a product of the constant Kτ and the quotient of Cp_ncvoff, and the sum of Cp_ramp, Cp_ncvoff, and Ccmp. Similar to the examples described in FIG. 3 and FIG. 6 above, the positive charge injection in the example described in FIG. 7 also therefore generates Kτ of settling error at time T2 to reduce a ramp settling time in the ramp signal, in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A comparison circuitry, comprising:
a comparator having first and second inputs and an output, wherein the first input of the comparator is configured to receive a pixel signal;
a switch coupled to the second input of the comparator, a reference generator, and a ramp generator; and
a first capacitance coupled to the switch, wherein the switch is configured to couple the first capacitance to the reference generator to charge the first capacitance to a reference voltage from the reference generator prior to a ramp event in a ramp signal from the ramp generator, wherein the switch is further configured to couple the first capacitance to the ramp signal from the ramp generator at an onset of the ramp event in the ramp signal, wherein the first capacitance is coupled to provide positive current injection to be combined with the ramp signal at the onset of the ramp event in the ramp signal to reduce a ramp settling time in the ramp signal, wherein the ramp signal is coupled to be provided to the second input of the comparator.

2. The comparison circuitry of claim 1, wherein the reference voltage from the reference generator is a constant voltage and is greater than the ramp signal prior to the ramp event in the ramp signal by a constant voltage difference.

3. The comparison circuitry of claim 2, wherein the constant voltage difference is equal to a product of a constant and a quotient of a sum of the first capacitance and an input capacitance of the comparator, and a sum of a capacitance on the ramp signal, the first capacitance, and the input capacitance of the comparator.

4. The comparison circuitry of claim 2, wherein the constant voltage difference is equal to a product of a constant and a quotient of the first capacitance and a sum of a capacitance of the comparator when the switch is switched to select the reference generator, and a sum of a capacitance on the ramp signal, the first capacitance, the input capacitance of the comparator when the switch is switched to select the reference generator, and an input capacitance of the comparator when the switch is switched to select the ramp generator.

5. The comparison circuitry of claim 2, wherein the constant voltage difference is equal to a product of a constant and a quotient of the first capacitance and a sum of a capacitance on the ramp signal, the first capacitance, and an input capacitance of the comparator.

6. The comparison circuitry of claim 1, further comprising a buffer coupled between an output of the ramp generator and the switch.

7. An imaging system, comprising:
an array of pixels to receive image light and generate an image charge voltage signal in response; and
readout circuitry coupled to the receive the image charge voltage signal from the array of pixels and provide a digital representation of the image charge voltage signal in response, the readout circuitry including a comparison circuitry to receive the image charge voltage signal, compare the image charge voltage signal to a ramp signal from a ramp generator, and provide the digital representation of the image charge voltage signal in response, wherein the comparison circuitry comprises:
a comparator having first and second inputs and an output, wherein the first input of the comparator is configured to receive the image charge voltage signal;
a switch coupled to the second input of the comparator, a reference generator, and the ramp generator; and
a first capacitance coupled to the switch, wherein the switch is configured to couple the first capacitance to the reference generator to charge the first capacitance to a reference voltage from the reference generator prior to a ramp event in the ramp signal from the ramp generator, wherein the switch is further configured to couple the first capacitance to the ramp signal from the ramp generator at an onset of the ramp event in the ramp signal, wherein the first capacitance is coupled to provide positive current injection to be combined with the ramp signal at the onset of the ramp event in the ramp signal to reduce a ramp settling time in the ramp signal, wherein the ramp signal is coupled to be provided to the second input of the comparator.

8. The imaging system of claim 7, wherein the reference voltage from the reference generator is a constant voltage and is greater than the ramp signal prior to the ramp event in the ramp signal by a constant voltage difference.

9. The imaging system of claim 8, wherein the constant voltage difference is equal to a product of a constant and a quotient of a sum of the first capacitance and an input capacitance of the comparator, and a sum of a capacitance on the ramp signal, the first capacitance, and the input capacitance of the comparator.

10. The imaging system of claim 8, wherein the constant voltage difference is equal to a product of a constant and a quotient of a sum of the first capacitance and an input capacitance of the comparator when the switch is switched to select the reference generator, and a sum of a capacitance on the ramp signal, the first capacitance, the input capacitance of the comparator when the switch is switched to select the reference generator, and an input capacitance of the comparator when the switch is switched to select the ramp generator.

11. The imaging system of claim 8, wherein the constant voltage difference is equal to a product of a constant and a quotient of the first capacitance and a sum of a capacitance on the ramp signal, the first capacitance, and an input capacitance of the comparator.

12. The imaging system of claim 7, wherein the comparison circuitry further comprises a buffer coupled between an output of the ramp generator and the switch.

13. A method of comparing an image charge signal to a ramp signal, comprising:
   receiving the image charge signal of a pixel of a pixel array at a first input of a comparator;
   generating the ramp signal with a ramp generator;
   charging a first capacitance to a reference voltage generated by a reference generator prior to a ramp event in the ramp signal;
   providing positive current injection from the first capacitance to the ramp signal at an onset of the ramp event in the ramp signal to reduce a ramp settling time in the ramp signal;
   receiving ramp signal combined with the positive current injection at a second input of the comparator during the ramp event in the ramp signal; and
   comparing the first input of the comparator and the second input of the comparator.

14. The method of claim 13, further comprising buffering the ramp signal from the ramp generator.

15. The method of claim 13, wherein the reference voltage from the reference generator is a constant voltage and is greater than the ramp signal prior to the ramp event in the ramp signal by a constant voltage difference.

16. The method of claim 15, wherein the constant voltage difference is equal to a product of a constant and a quotient of a sum of the first capacitance and an input capacitance of the comparator, and a sum of a capacitance on the ramp signal, the first capacitance, and the input capacitance of the comparator.

17. The method of claim 15, wherein the constant voltage difference is equal to a product of a constant and a quotient of a sum of the first capacitance and an input capacitance of the comparator when the switch is switched to select the reference generator, and a sum of a capacitance on the ramp signal, the first capacitance, the input capacitance of the comparator when the switch is switched to select the reference generator, and an input capacitance of the comparator when the switch is switched to select the ramp generator.

18. The method of claim 15, wherein the constant voltage difference is equal to a product of a constant and a quotient of the first capacitance and a sum of a capacitance on the ramp signal, the first capacitance, and an input capacitance of the comparator.

* * * * *